(12) United States Patent
Liu et al.

(10) Patent No.: US 11,302,242 B2
(45) Date of Patent: Apr. 12, 2022

(54) SHIFT REGISTER UNIT INCLUDING RESET CONTROL, METHOD OF DRIVING THE SAME, GATE DRIVING CIRCUIT AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Shuainan Liu, Beijing (CN); Lidong Wang, Beijing (CN); Huan Bao, Beijing (CN); Jianye Tang, Beijing (CN); Desheng Xiang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 147 days.

(21) Appl. No.: 16/623,541

(22) PCT Filed: Jun. 28, 2019

(86) PCT No.: PCT/CN2019/093627
§ 371 (c)(1),
(2) Date: Dec. 17, 2019

(87) PCT Pub. No.: WO2020/001603
PCT Pub. Date: Jan. 2, 2020

(65) Prior Publication Data
US 2021/0295763 A1    Sep. 23, 2021

(30) Foreign Application Priority Data

Jun. 29, 2018    (CN) .......................... 201810695672.7

(51) Int. Cl.
*G09G 5/00*    (2006.01)
*G09G 3/20*    (2006.01)
(Continued)

(52) U.S. Cl.
CPC ......... *G09G 3/2092* (2013.01); *G11C 19/184* (2013.01); *G11C 19/28* (2013.01);
(Continued)

(58) Field of Classification Search
CPC ......... G09G 3/2092; G09G 2300/0426; G09G 2310/0286; G09G 2310/061;
(Continued)

(56) References Cited

U.S. PATENT DOCUMENTS

2011/0057926 A1* 3/2011 Shang ................. G09G 3/3677
345/213
2011/0134090 A1* 6/2011 Iwamoto ............. G09G 3/3677
345/206
(Continued)

FOREIGN PATENT DOCUMENTS

CN    101609718 A    12/2009
CN    203882580 U    10/2014
(Continued)

OTHER PUBLICATIONS

First Office Action for Chinese Application No. 201810695672.7, dated Aug. 28, 2019, 9 Pages.
(Continued)

*Primary Examiner* — Adam J Snyder
(74) *Attorney, Agent, or Firm* — Brooks Kushman P.C.

(57) ABSTRACT

A shift register unit, a driving method thereof, a gate driving circuit and a display device are provided. The shift register unit includes a reset circuit and a reset control circuit, the reset circuit is connected to a pull-up node, and configured to reset a potential of the pull-up node during a reset stage;
(Continued)

and the reset control circuit is connected to the reset circuit and configured to maintain the potential of the pull-up node at a first voltage during an output stage of each display period.

18 Claims, 4 Drawing Sheets

(51) Int. Cl.
  *G11C 19/18* (2006.01)
  *G11C 19/28* (2006.01)
  *G09G 3/3266* (2016.01)

(52) U.S. Cl.
  CPC .............. *G09G 3/20* (2013.01); *G09G 3/3266* (2013.01); *G09G 2300/0426* (2013.01); *G09G 2310/0286* (2013.01); *G09G 2310/061* (2013.01); *G09G 2310/08* (2013.01)

(58) Field of Classification Search
  CPC ...... G09G 2310/08; G09G 3/20; G09G 3/344; G09G 3/3266; G11C 19/184; G11C 19/28
  See application file for complete search history.

(56) References Cited

U.S. PATENT DOCUMENTS

| | | |
|---|---|---|
| 2013/0249884 A1 | 9/2013 | Kim et al. |
| 2014/0169518 A1* | 6/2014 | Kong .................. G09G 3/3674 377/64 |
| 2016/0172054 A1 | 6/2016 | Shao et al. |
| 2017/0116945 A1* | 4/2017 | Cho ..................... G09G 3/3677 |
| 2019/0057637 A1 | 2/2019 | Fan et al. |

FOREIGN PATENT DOCUMENTS

| | | |
|---|---|---|
| CN | 104392704 A | 3/2015 |
| CN | 106601176 A | 4/2017 |
| CN | 108717844 A | 10/2018 |
| EP | 2357642 A1 | 8/2011 |
| KR | 20130107528 A | 10/2013 |

OTHER PUBLICATIONS

International Search Report and Written Opinion for Application No. PCT/CN2019/093627, dated Sep. 27, 2019, 10 Pages.

* cited by examiner

SHIFT REGISTER UNIT INCLUDING RESET CONTROL, METHOD OF DRIVING THE SAME, GATE DRIVING CIRCUIT AND DISPLAY DEVICE

CROSS-REFERENCE TO RELATED APPLICATIONS

This application is the U.S. national phase of PCT Application No. PCT/CN2019/093627 filed on Jun. 28, 2019, which claims priority to Chinese Patent Application No. 201810695672.7 filed on Jun. 29, 2018, which are incorporated herein by reference in their entireties.

TECHNICAL FIELD

The present disclosure relates to the field of display technologies, in particular to a shift register unit, a method of driving the same, a gate driving circuit and a display device.

BACKGROUND

In a narrow-frame display module of the related art, there is no light-shielding tape on both sides of a backlight, and a Gate driving circuit On Array (GOA, which is disposed on the array substrate) on both sides of the backlight is directly illuminated by the backlight. Under such conditions, a reset transistor of a shift register unit included in the GOA generates carriers due to illumination, and leakage current of the reset transistor is large, so that potential of a pull-up node is pulled down during an output stage, which causes the shift register unit to fail to stably output a gate driving signal, and causes a decrease of a gate driving voltage and an abnormal display.

SUMMARY

The present disclosure provides a shift register unit, including a reset circuit and a reset control circuit, wherein the reset circuit is connected to a pull-up node and configured to reset a potential of the pull-up node during a reset stage; and the reset control circuit is connected to the reset circuit, and configured to maintain the potential of the pull-up node at a first voltage during an output stage of each display period.

Optionally, wherein the reset circuit comprises a reset transistor, a gate electrode of the reset transistor is connected to a reset control terminal, a first electrode of the reset transistor is connected to the pull-up node, and a second electrode of the reset transistor is connected to a reset voltage terminal, one of the first electrode and the second electrode is a source electrode, and the other of the first electrode and the second electrode is a drain electrode; and the reset control circuit is connected to the reset control terminal and the reset voltage terminal, and the reset transistor is put in a reverse locked state by controlling a potential of the reset control terminal and/or a potential of the reset voltage terminal during the output stage.

Optionally, during the output stage, the reset control circuit conducts a connection between the reset control terminal and the reset voltage terminal under the control of a reverse locking control terminal to control a gate-source voltage of the reset transistor to be in a predetermined voltage range.

Optionally, during the reset stage, the reset control circuit breaks a connection between the reset control terminal and the reset voltage terminal under the control of a reverse locking control terminal.

The reset transistor is an n-type transistor, the predetermined voltage range is smaller than or equal to 0V; or, the reset transistor is a p-type transistor, and the predetermined voltage range is larger than or equal to 0V.

Optionally, the reverse locking control terminal includes a first reverse locking control terminal and a second reverse locking control terminal; the first reverse locking control terminal is connected to the pull-up node, and the second reverse locking control terminal is connected to a clock signal terminal; the reset control circuit includes a first locking transistor and a second locking transistor, wherein, a gate electrode of the first locking transistor is connected to the pull-up node, and a first electrode of the first locking transistor is connected to the reset voltage terminal; and a gate electrode of the second locking transistor is connected to the clock signal terminal, a first electrode of the second locking transistor is connected to a second electrode of the first locking transistor, and a second electrode of the second locking transistor is connected to the reset control terminal.

Optionally, the shift register unit further includes an output circuit; wherein, the output circuit is respectively connected to the pull-up node, a clock signal terminal and a gate driving signal output terminal, and is configured to write a clock signal output by the clock signal terminal to the gate driving signal output terminal under the control of the pull-up node during an input stage and during the output stage; and the reset circuit is further connected to the gate driving signal output terminal, and is configured to, during the reset stage, to write a reset voltage output by a reset voltage terminal to the gate driving signal output terminal under the control of a reset control terminal, to reset a voltage of the gate driving signal output terminal.

Optionally, the output circuit includes an output transistor, and the reset circuit further includes an output reset transistor, wherein, a gate electrode of the output transistor is connected to the pull-up node, a first electrode of the output transistor is connected to the clock signal terminal, and a second electrode of the output transistor is connected to the gate driving signal output terminal; and a gate electrode of the output reset transistor is connected to the reset control terminal, a first electrode of the output reset transistor is connected to the gate driving signal output terminal, and a second electrode of the output reset transistor is connected to the reset voltage terminal.

Optionally, the shift register unit in the present disclosure further includes: an input circuit respectively connected to an input terminal and the pull-up node, and configured to control the potential of the pull-up node under the control of the input terminal during an input stage; and a storage circuit connected to the pull-up node and configured to maintain the potential of the pull-up node during the input stage and boost the potential of the pull-up node during the output stage.

Optionally, the input circuit includes an input transistor, both a gate electrode of the input transistor and a first electrode of the input transistor are connected to the input terminal, and a second electrode of the input transistor is connected to the pull-up node; and the storage circuit includes a storage capacitor, a first electrode of the storage capacitor is connected to the pull-up node, and a second electrode of the storage capacitor is connected to the gate driving signal output terminal.

The present disclosure further provides a method of driving the shift register unit. The method includes: maintaining, by the reset control circuit, the potential of the pull-up node at the first voltage during the output stage of each display period.

Optionally, the reset circuit includes a reset transistor, a gate electrode of the reset transistor is connected to a reset control terminal, a first electrode of the reset transistor is connected to the pull-up node, and a second electrode of the reset transistor is connected to a reset voltage terminal, the maintaining the potential of the pull-up node at the first voltage during the output stage of each display period by the reset control circuit includes: putting, by the reset control circuit, the reset transistor in a reverse locked state by controlling a potential of the reset control terminal and/or a potential of the reset voltage terminal during the output stage.

Optionally, the putting the reset transistor in the reverse locked state by controlling the potential of the reset control terminal and/or the potential of the reset voltage terminal during the output stage by the reset control circuit includes: during the output stage, conducting, by the reset control circuit, a connection between the reset control terminal and the reset voltage terminal under the control of a reverse locking control terminal to control a gate-source voltage of the reset transistor to be in a predetermined voltage range; wherein, the reset transistor is an n-type transistor, the predetermined voltage range is smaller than or equal to 0V; or, the reset transistor is a p-type transistor, and the predetermined voltage range is larger than or equal to 0V.

Optionally, the display period further includes the reset stage, the driving method further includes: during the reset stage, breaking, by the reset control circuit, the connection between the reset control terminal and the reset voltage terminal under the control of the reverse locking control terminal.

Optionally, the reverse locking control terminal includes a first reverse locking control terminal and a second reverse locking control terminal; the first reverse locking control terminal is connected to the pull-up node, and the second reverse locking control terminal is connected to a clock signal terminal; the driving method further includes: during the output stage, conducting, by the reset control circuit, the connection between the reset control terminal and the reset voltage terminal under the control of the pull-up node and the clock signal terminal to control the gate-source voltage of the reset transistor to be in the predetermined voltage range; and during the reset stage, breaking, by the reset control circuit, the connection between the reset control terminal and the reset voltage terminal under the control of the clock signal terminal.

Optionally, the driving method further includes: during the reset stage, under the control of the reset control terminal, controlling, by the reset circuit, the potential of the pull-up node to be a reset voltage, and controlling, by the reset circuit, a gate driving signal output terminal to output the reset voltage; wherein, the reset voltage is a voltage input to the reset voltage terminal.

Optionally, the display period further includes an input stage and an output cut-off maintaining stage, and the method of driving the shift register unit further includes: during the input stage, breaking, by the reset control circuit, the connection between the reset control terminal and the reset voltage terminal under the control of the clock signal terminal to control the gate-source voltage of the reset transistor to be in the predetermined voltage range; and during the output cut-off maintaining stage, breaking, by the reset control circuit, the connection between the reset control terminal and the reset voltage terminal under the control of the pull-up node to control the gate-source voltage of the reset transistor to be in the predetermined voltage range.

The present disclosure further provides a gate driving circuit, including a plurality stages of above shift register units; the shift register unit further includes a gate driving signal output terminal and an input terminal; except for a first stage of shift register unit, the input terminal of each stage of shift register unit is connected to the gate driving signal output terminal of a previous stage of shift register unit; and except for a last stage of shift register unit, a reset control terminal of each stage of shift register unit is connected to the gate driving signal output terminal of a next stage of shift register unit.

The present disclosure further provides a display device including the above gate driving circuit.

DETAILED DESCRIPTION

Technical solutions of embodiments of the present disclosure will be illustrated clearly and completely hereinafter with reference to the accompanying drawings. Obviously, the embodiments described are merely a portion of embodiments of the present disclosure, not all of them. Based on the embodiments of the present disclosure, all other embodiments acquired by a person skilled in the art without creative work will fall within the protection scope of the present disclosure.

Transistors in all embodiments of the present disclosure may be thin film transistors or field effect transistors or other devices with the same characteristics. In the embodiments of the present disclosure, in order to distinguish two electrodes of a transistor besides a gate electrode, one of the two electrodes is referred to as a first electrode, and the other is referred to as a second electrode. In a practical operation, the first electrode may be a drain electrode, the second electrode may be a source electrode; or, the first electrode may be the source electrode, and the second electrode may be the drain electrode.

A main object of the present disclosure is to provide a shift register unit, a driving method, a gate driving circuit and a display device, which solve a problem that, in the related art, a reset transistor in a shift register unit generates carriers due to illumination, and leakage current of the reset transistor is large, so that potential of a pull-up node is pulled down during an output stage, which causes the shift register unit to fail to stably output a gate driving signal, and causes an abnormal display. The shift register unit in an embodiment of the present disclosure includes a reset circuit, the reset circuit is connected to the pull-up node, and configured to reset the potential of the pull-up node during a reset stage;

and a reset control circuit, the reset control circuit is connected to the reset circuit and configured to reduce leakage current of the reset transistor during the output stage, thereby maintaining the potential of the pull-up node at a first voltage. The output stage is a stage in which a gate driving signal is output from a clock signal terminal to a gate driving signal output terminal through an output circuit.

Optionally, the first voltage may be a high voltage, but is not limited thereto. During the output stage, the reset control circuit reduces the leakage current of the reset circuit to maintain the potential of the pull-up node PU at the first voltage, such that the output circuit included in the shift register unit and connected to the pull-up node PU may output the gate driving signal normally, a corresponding row of pixel units receives the gate driving signal, and switching transistors included in the corresponding row of pixel units are turned on to write a data voltage on a corresponding data line in the column direction into the pixel unit in the corresponding row and the corresponding column to realize a normal display.

Optionally, the reset circuit may include a reset transistor, a gate electrode of the reset transistor is connected to a reset control terminal, a first electrode of the reset transistor is connected to the pull-up node, and a second electrode of the reset transistor is connected to a reset voltage terminal; and the reset control circuit is connected to the reset control terminal and/or the reset voltage terminal, and configured to reduce the leakage current of the reset transistor by controlling a potential of the reset control terminal and/or a potential of the reset voltage terminal during the output stage.

The reset control circuit is added into the shift register unit according to the embodiment of the present disclosure to reduce the leakage current of the reset transistor by controlling the potential of the reset control terminal and/or the potential of the reset voltage terminal without changing an existing timing during the output stage (the output stage is the stage in which the shift register unit outputs the corresponding gate driving signal), thereby realizing the control of the leakage current of the reset transistor, and avoiding an influence of the leakage current of the reset transistor on outputting the gate driving signal, and then the display is not affected.

According to an embodiment, the reset control circuit may control a gate-source voltage of the reset transistor in the reset circuit to be in a predetermined voltage range during the output stage by controlling the potential of the reset control terminal, or by controlling the potential of the reset control terminal and the potential of the reset voltage terminal, so that the reset transistor is in a reverse locked state (a cut-off state of a transistor), thereby reducing the leakage current of the reset transistor during the output phase. The reset transistor is an n-type transistor, the predetermined voltage range is smaller than or equal to 0V; or, the reset transistor is a p-type transistor, and the predetermined voltage range is larger than or equal to 0V.

In a practical operation, when the reset transistor is the n-type transistor, the gate-source voltage of the reset transistor is a positive voltage. Even if the gate-source voltage is smaller than a threshold voltage of the reset transistor, the leakage current may also be generated due to backlight illumination, which causes an unstable output of the gate driving circuit and an abnormal display of a display module. Therefore, according to the embodiments of the present disclosure, the reset transistor needs to be maintained in the reverse locked state, that is, when the reset transistor is the n-type transistor, the gate-source voltage is smaller than or equal to 0V; or, when the reset transistor is the p-type transistor, and the gate-source voltage is larger than or equal to 0V, so as to maintain the leakage current of the reset transistor at a minimum value, thus the display module may display normally.

According to another optional embodiment, the reset control circuit may reduce the leakage current of the reset transistor by controlling the potential of the reset voltage terminal during the output stage. For example, the potential of the reset voltage terminal may be set as the first voltage, so that potential of a source electrode of the reset transistor is equal to potential of a drain electrode of the reset transistor, thereby reducing the leakage current of the reset transistor.

In a practical operation, during the output stage, the reset control circuit may conduct a connection between the reset control terminal and the reset voltage terminal under the control of a reverse locking control terminal to control the gate-source voltage of the reset transistor to be in the predetermined voltage range. The reset control circuit may further, during the reset stage, break the connection between the reset control terminal and the reset voltage terminal under the control of the reverse locking control terminal, so that the reset transistor in the reset circuit may reset the pull-up node under the control of the reset control terminal, and the reset circuit in the shift register unit may pull down potential of the gate driving signal. The reset transistor is the n-type transistor, the predetermined voltage range is smaller than or equal to 0V; or, the reset transistor is the p-type transistor, and the predetermined voltage range is larger than or equal to 0V.

Optionally, the reverse locking control terminal may include a first reverse locking control terminal and a second reverse locking control terminal, the first reverse locking control terminal may be connected to the pull-up node, and the second reverse locking control terminal may be connected to the clock signal terminal, which is not limited thereto.

Optionally, the reset control circuit may further include a first locking transistor and a second locking transistor. A gate electrode of the first locking transistor is connected to the pull-up node, and a first electrode of the first locking transistor is connected to the reset voltage terminal; and a gate electrode of the second locking transistor is connected to the clock signal terminal, a first electrode of the second locking transistor is connected to a second electrode of the first locking transistor, and a second electrode of the second locking transistor is connected to the reset control terminal.

Optionally, the reset control circuit may further include the output circuit. The output circuit is respectively connected to the pull-up node, the clock signal terminal and the gate driving signal output terminal, and is configured to write a clock signal output by the clock signal terminal to the gate driving signal output terminal under the control of the pull-up node during the input stage and during the output stage. The reset circuit is further connected to the gate driving signal output terminal, and is configured to, during the reset stage, control a connection between the gate driving signal output terminal and the reset voltage terminal to reset voltage of the gate driving signal output terminal under the control of the reset control terminal.

Optionally, the shift register unit may further include: an input circuit respectively connected to an input terminal and the pull-up node, and configured to control the potential of the pull-up node under the control of the input terminal during the input stage; and a storage circuit connected to the pull-up node, and configured to maintain the potential of the pull-up node during the input stage and boosting the potential of the pull-up node during the output stage.

Optionally, the input circuit may include an input transistor, both a gate electrode of the input transistor and a first electrode of the input transistor are connected to the input terminal, and a second electrode of the input transistor is connected to the pull-up node; and the storage circuit includes a storage capacitor, a first electrode of the storage capacitor is connected to the pull-up node, and a second electrode of the storage capacitor is connected to the gate driving signal output terminal.

Compared with the related art, the reset control circuit is added into the shift register unit, the driving method, the gate driving circuit, and the display device according to the present disclosure, and the reset control circuit reduces the leakage current of the reset circuit to maintain the potential of the pull-up node PU, such that the output circuit of the shift register unit connected to the pull-up node PU may output the gate driving signal normally, the corresponding row of pixel units receives the gate driving signal, and the switching transistors included in the corresponding row of pixel units are turned on to write the data voltage on the corresponding data line in the column direction into the pixel unit in a corresponding row and a corresponding column to realize the normal display.

Figure 1:
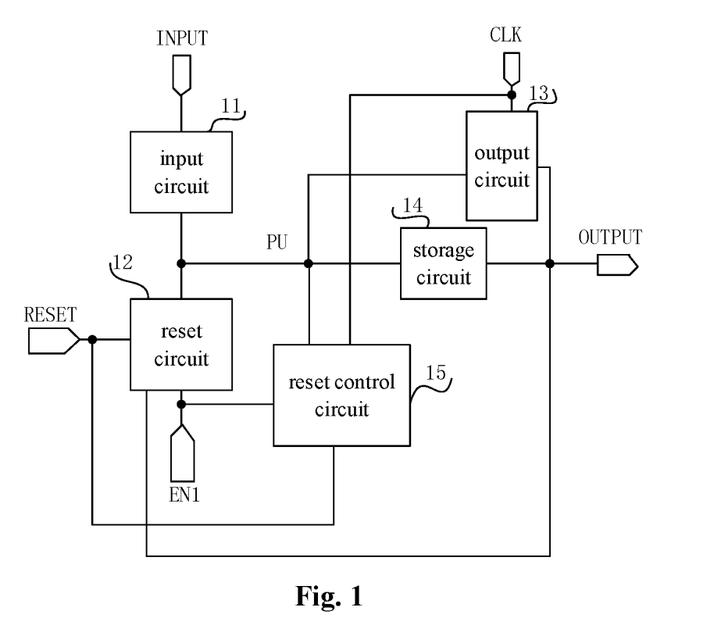
FIG. 1 is a schematic structural diagram illustrating a shift register unit according to an embodiment of the present disclosure.

As shown in FIG. 1, the shift register unit according to the embodiment of the present disclosure includes an input circuit 11, a reset circuit 12, an output circuit 13, a storage circuit 14, and a reset control circuit 15.

The input circuit 11 is respectively connected to an input terminal INPUT and the pull-up node PU, and configured to conduct a connection between the input terminal INPUT and the pull-up node PU under the control of the input terminal INPUT during an input stage, thereby enabling the potential of the pull-up node PU be the first voltage in the input stage (in a practical operation, the first voltage may be a high voltage, but is not limited thereto).

The reset circuit 12 is respectively connected to a reset control terminal RESET, a reset voltage terminal EN1, the pull-up node PU, and a gate driving signal output terminal OUTPUT, and is configured to write a reset voltage output by the reset voltage terminal EN1 to the pull-up node PU under the control of the reset control terminal RESET during a reset stage. The reset circuit 12 is further configured to write the reset voltage output by the reset voltage terminal EN1 to the gate driving signal output terminal OUTPUT during the reset stage to reset potential of the gate driving signal output by the gate driving signal output terminal OUTPUT.

The output circuit 13 is respectively connected to the pull-up node PU, a clock signal terminal CLK and the gate driving signal output terminal OUTPUT, and is configured to write a clock signal output by the clock signal terminal CLK to the gate driving signal output terminal OUTPUT under the control of the pull-up node PU during the input stage, such that an inactive level (the inactive level refers to a level by which a switching transistor in a pixel unit is turned off, the gate electrode of the switching transistor is connected to the gate driving signal output terminal OUTPUT) is output by the gate driving signal output terminal OUTPUT. The output circuit 13 is further configured to write the clock signal output by the clock signal terminal CLK to the gate driving signal output terminal OUTPUT under the control of the pull-up node PU during an output stage, such that a gate driving signal (the gate driving signal refers to a signal by which the switching transistor in the pixel unit is turned on, the gate electrode of the switching transistor is connected to the gate driving signal output terminal OUTPUT) is output by the gate driving signal output terminal OUTPUT.

A first electrode of the storage circuit 14 is connected to the pull-up node PU, and a second electrode of the storage circuit 14 is connected to the gate driving signal output terminal OUTPUT; the storage circuit 14 is configured to maintain the potential of the pull-up node during the input stage and boost the potential of the pull-up node during the output stage.

The reset circuit 12 includes a reset transistor (not shown in FIG. 1), a gate electrode of the reset transistor is connected to the reset control terminal RESET, and a first electrode of the reset transistor is connected to the pull-up node PU, a second electrode of the reset transistor is connected to the reset voltage terminal EN1.

The reset control circuit 15 is connected to the reset control terminal RESET, the clock signal terminal CLK, the pull-up node PU, and the reset voltage terminal EN1, respectively. The reset control circuit 15 is configured to control a connection between the reset control terminal RESET and the reset voltage terminal EN1 under the control of the clock signal terminal CLK and the pull-up node PU during the output stage, such that a gate-source voltage of the reset transistor (not shown in FIG. 1) is within a predetermined voltage range, and a reverse level is applied to the reset transistor to perform a reverse lock on the reset transistor, thereby reducing a leakage current of the reset transistor during the output stage. Applying the reverse level to the reset transistor refers to: controlling the gate-source voltage of the reset transistor to be smaller than or equal to 0V when the reset transistor is an n-type transistor and a threshold voltage of the reset transistor is a positive voltage; or controlling the gate-source voltage of the reset transistor to be larger than or equal to 0V when the reset transistor is a p-type transistor and a threshold voltage of the reset transistor is a negative voltage.

The reset control circuit 15 is further configured to break the connection between the reset control terminal RESET and the reset voltage terminal EN1 under the control of the clock signal terminal CLK during the reset stage, such that the reset transistor may be turned on to reset the potential of the pull-up node PU during the reset stage.

The reset control circuit 15 is added into the shift register unit according to the embodiment of the present disclosure to conduct the connection between the reset control terminal RESET and the reset voltage terminal EN1 during the output stage (the output stage is the stage in which the shift register unit outputs the corresponding gate driving signal), thereby realizing the control of the leakage current of the reset transistor (not shown in FIG. 1, and will be introduced in subsequent by combining with the embodiments) in the reset circuit 12 without changing the existing timing, and avoiding the influence of the leakage current of the reset transistor on outputting the gate driving signal, and then the display is not affected.

During the output stage, the reset control circuit 15 conducts the connection between the reset control terminal RESET and the reset voltage terminal EN1, at this time, since a low voltage is input at the EN1, and the gate electrode of the reset transistor included in the reset circuit is connected to the RESET, a low level is input into the gate electrode of the reset transistor, the reset transistor is in the reverse locked state, thereby avoiding a phenomenon that a large leakage current easily occurs when the reset transistor is illuminated.

In the reset phase, the reset control circuit 15 breaks the connection between the reset control terminal RESET and the reset voltage terminal EN1, and a high level is output during the reset stage RESET, so that the reset transistor may be turned on during the reset stage, the reset transistor included in the reset circuit 12 may discharge the pull-up node PU to correctly pull down the potential of the gate driving signal.

In a practical operation, each display period may sequentially include an input stage, an output stage, a reset stage, and an output cut-off maintaining stage. When the shift register unit shown in FIG. 1 is in operation, during the input stage, the inactive level is output at the clock signal terminal CLK. Under the control of the input terminal INPUT, the input circuit 11 pulls up the potential of the pull-up node PU, and the storage circuit 14 maintains the potential of the pull-up node PU. The output circuit 13 conducts a connection between the gate driving signal output terminal OUTPUT and the clock signal terminal CLK under the control of the pull-up node PU, so that the inactive level is output at the gate driving signal output terminal OUTPUT.

During the output stage, an effective level is output at the clock signal terminal CLK, the storage circuit 14 boots the potential of the pull-up node PU, and the output circuit 13 conducts the connection between the gate driving signal output terminal OUTPUT and the clock signal terminal CLK under the control of the pull-up node PU, so that the effective level is output at the gate driving signal output terminal OUTPUT. The reset control circuit 15 conducts the connection between the reset control terminal RESET and the reset voltage terminal EN1 under the control of the pull-up node PU and the clock signal terminal CLK, such that the low voltage is input into the gate electrode of the reset transistor in the reset circuit from the EN1, the reset transistor is in the reverse locked state, thereby avoiding a phenomenon that a leakage current occurs in the reset transistor of the reset circuit 12.

During the reset stage, under the control of the reset control terminal RESET, the reset circuit 12 conducts the connection between the pull-up node PU and the reset voltage terminal EN1 to reset the potential of the pull-up node PU; under the control of the pull-up node PU, the output circuit 13 breaks the connection between the gate driving signal output terminal OUTPUT and the clock signal terminal CLK; under the control of the reset control terminal RESET, the reset circuit 12 conducts the connection between the gate driving signal output terminal OUTPUT and the reset voltage terminal EN1, so that the reset voltage (the reset voltage is a voltage input by the reset voltage terminal) is output at the gate driving signal output terminal OUTPUT; under the control of the clock signal terminal CLK, the reset control circuit 15 breaks the connection between the reset voltage terminal EN1 and the reset control terminal RESET, so that the reset transistor included in the reset circuit 12 may be turned on during the reset stage, thereby realizing the discharge of the pull-up node PU, and pulling down the potential of the gate driving signal.

During the output cut-off maintaining stage, the reset control circuit 15 breaks the connection between the reset control terminal RESET and the reset voltage terminal EN1 under the control of the pull-up node PU. Under the control of the pull-up node PU and the reset control terminal RESET, the output circuit 13 maintains the potential of the gate driving signal; the gate driving signal is a signal output by the gate driving signal output terminal OUTPUT.

Figure 2:
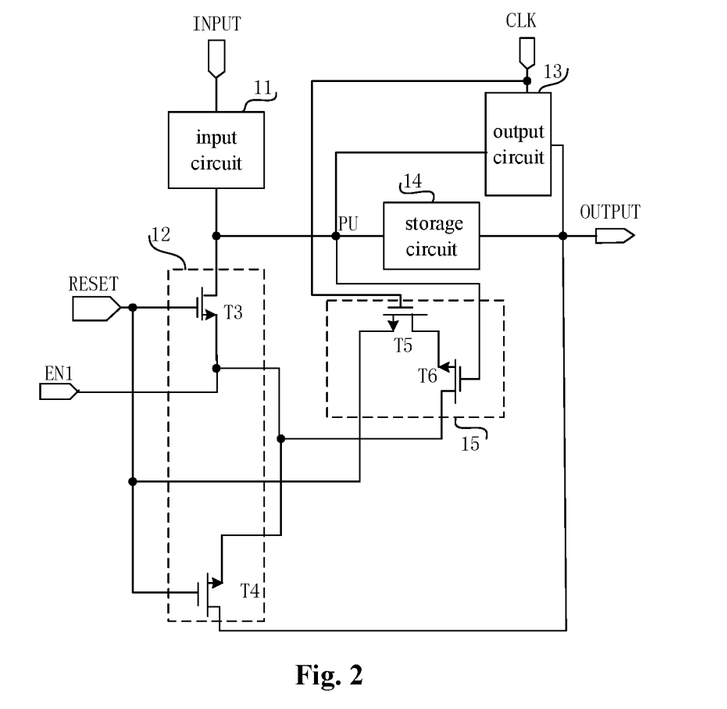
FIG. 2 is a schematic structural diagram illustrating a shift register unit according to another embodiment of the present disclosure.

As shown in FIG. 2, on the basis of the embodiment of the shift register unit shown in FIG. 1, the reset control circuit 15 includes a first locking transistor T6 and a second locking transistor T5. A gate electrode of the first locking transistor T6 is connected to the pull-up node PU, and a drain electrode of the first locking transistor T6 is connected to the reset voltage terminal EN1. A gate electrode of the second locking transistor T5 is connected to the clock signal terminal CLK, a drain electrode of the second locking transistor T5 is connected to a source electrode of the first locking transistor T6, and a source electrode of the second locking transistor T5 is connected to the reset control terminal RESET.

As shown in FIG. 2, the reset circuit 12 includes a reset transistor T3 and an output reset transistor T4. A gate electrode of the reset transistor T3 is connected to the reset control terminal RESET, a drain electrode of the reset transistor T3 is connected to the pull-up node PU, and a source electrode of the reset transistor T3 is connected to the reset voltage terminal EN1. A gate electrode of the output transistor T4 is connected to the reset control terminal RESET, a drain electrode of the output transistor T4 is connected to the gate driving signal output terminal OUTPUT, and a source electrode of the output transistor T4 is connected to the reset voltage terminal EN1.

In the embodiment shown in FIG. 2, all the T6, the T5, the T3, and the T4 are n-type transistors, but are not limited thereto.

When the shift register unit shown in FIG. 2 of the present disclosure is in operation, during the output stage, both the T6 and the T5 are turned on to conduct the connection between the RESET and the EN1, and the low level is input at the EN1, so that a gate-source voltage of the T3 is a reverse voltage, and a reverse voltage lock is performed on the T3. Thus a leakage current of the T3 is maintained at the minimum value, and the normal display of the module is not affected.

When the embodiment of the present disclosure as shown in FIG. 2 is in operation, the T5 and the T6 are used together, the reverse voltage lock of the T3 may be realized, and the T5 is controlled by the CLK, so that the T3 is controlled by the EN1 only during the output stage. When a pixel is needed to be discharged (i.e., during the reset stage), a low level is output at the CLK, and the T5 is turned off. Although the T6 is continuously turned on due to the PU, the EN1 may no longer affect the T3, and thus the potential of the PU can be discharged. The embodiment of the present disclosure may realize the control of the leakage current of the T3 without changing an existing display timing, and avoid an influence of the leakage current on the normal display.

The shift register unit of the present disclosure will be described in the following embodiments.

Figure 3:
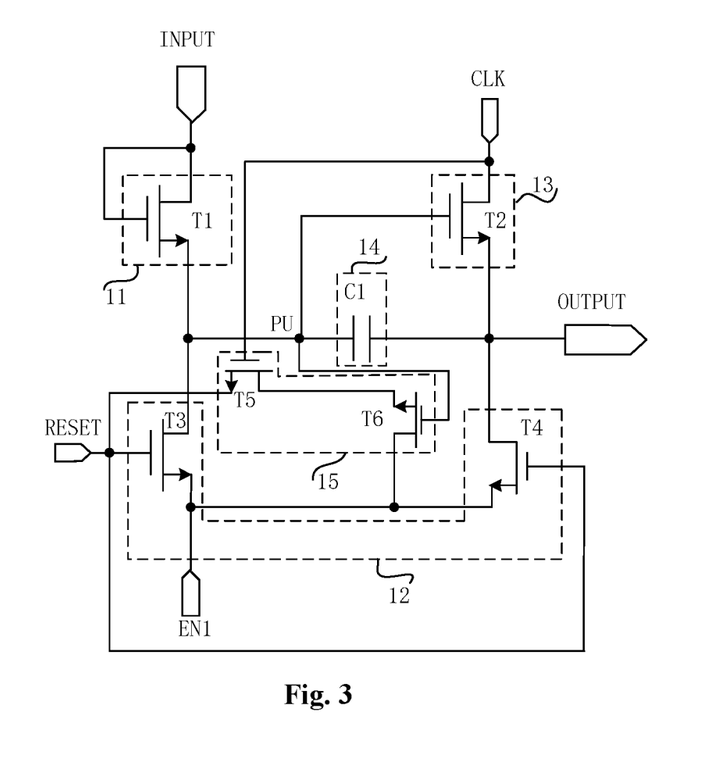
FIG. 3 is a circuit diagram of a shift register unit according to an embodiment of the present disclosure.

As shown in FIG. 3, some embodiments of the shift register unit of the present disclosure includes the input circuit 11, the reset circuit 12, the output circuit 13, the storage circuit 14, and the reset control circuit 15.

The input circuit 11 includes an input transistor T1, both a gate electrode of the input transistor T1 and a drain electrode of the input transistor T1 are connected to the input terminal INPUT, and a source electrode of the input transistor T1 is connected to the pull-up node PU.

The reset circuit 12 includes the reset transistor T3 and the output reset transistor T4. The gate electrode of the reset transistor T3 is connected to the reset control terminal RESET, the drain electrode of the reset transistor T3 is connected to the pull-up node PU, and the source electrode of the reset transistor T3 is connected to the reset voltage terminal EN1. The gate electrode of the output reset transistor T4 is connected to the reset control terminal RESET, the drain electrode of the output reset transistor T4 is connected to the gate driving signal output terminal OUTPUT, and the source electrode of the output reset transistor T4 is connected to the reset voltage terminal EN1.

The output circuit includes an output transistor T2, a gate electrode of the output transistor T2 is connected to the pull-up node PU, a drain electrode of the output transistor T2 is connected to the clock signal terminal CLK, and a source electrode of the output transistor T2 is connected to the gate driving signal output terminal OUTPUT.

The storage circuit 14 includes a storage capacitor C1, a first electrode of the storage capacitor C1 is connected to the pull-up node PU, and a second electrode of the storage capacitor C1 is connected to the gate driving signal output terminal OUTPUT.

The reset control circuit 15 includes the first locking transistor T6 and the second locking transistor T5. A gate electrode of the first locking transistor T6 is connected to the pull-up node PU, and the drain electrode of the first locking transistor T6 is connected to the reset voltage terminal EN1. A gate electrode of the second locking transistor T5 is connected to the clock signal terminal CLK, the drain electrode of the second locking transistor T5 is connected to the source electrode of the first locking transistor T6, and the source electrode of the second locking transistor T5 is connected to the reset control terminal RESET.

In the embodiments of the shift register unit shown in FIG. 3, all transistors are n-type transistors, but are not limited thereto.

A principle of leakage current of the T3 is as follows: during the input stage, the C1 is charged by an input signal from the INPUT. After the charging is completed, the input signal is reset to zero potential. During the output stage, the C1 boots the potential of the PU to ensure an output of the gate driving signal; and during the output stage, there is no signal input into the RESET, the RESET maintains at a zero potential state. When the T3 is illuminated, if the T3 is not locked tightly by the reverse voltage, there is a probability of large leakage current occurring in the T3. At this time, a low level is input at the EN1, thus causing a leakage current flowing from the PU to the EN1 through the T3, and causing the potential of the PU to drop. Thus, the T2 may not maintain in an effective turned-on state, the output of the gate driving signal is unstable, the pixel may not be charged by the OUTPUT effectively, which causes the abnormal display of the module.

When the shift register unit shown in FIG. 3 of the present disclosure is in operation, during each display period, in the input stage, a high level is input at the INPUT, a low level is input at the RESET, the T1 is turned on, the C1 is charged by INPUT through T1, so that the potential of the PU is a high level, a low level is input at the CLK, the T2 is turned on, and a low level is output at the OUTPUT; the T5 is turned off, so that the connection between the RESET and the EN1 is broke.

In the output stage, a low level is input at the INPUT, a low level is input at the RESET, the C1 boots the potential of the PU, a high level is output at the CLK, a high level is output at the OUTPUT, and both the T5 and the T6 are turned on to conduct the connection between the RESET and the EN1, the reset voltage input at the EN1 is a low level, so that a reverse voltage lock is performed on the T3, a leakage current of the T3 is maintained at the minimum value, and the normal display of the module is not affected. And since the gate electrode of T4 is also connected to the RESET, during the output stage, the T4 is also locked by the reverse voltage, a leakage current of the T4 is reduced, and the gate driving signal output by the OUTPUT is not affected.

In the reset stage, a low level is input at the INPUT, a high level is input at the RESET, a low level is output at the CLK, the T5 is turned off to break the connection between the RESET and the EN1, and the T3 is turned on to discharge the potential of the PU, so that the potential of the PU becomes a low level. And the T4 is turned on to conduct the connection between the OUTPUT and the EN1, and a low level is output at the OUTPUT.

In the output cut-off maintaining stage, a low level is input both at the INPUT and the RESET, the potential of the PU maintains at a low level, the T6 is turned off to break the connection between the RESET and the EN1, and a low level is continued to be output at the OUTPUT.

The method of driving the shift register unit according to the embodiments of the present disclosure is used for driving the above shift register unit, the method of driving the shift register unit includes: maintaining, by the reset control circuit, the potential of the pull-up node at the first voltage during the output stage of each display period.

Optionally, the first voltage may be a high voltage, but is not limited thereto. During the output stage, the reset control circuit reduces the leakage current of the reset circuit to maintain the potential of the pull-up node PU at the first voltage, such that the output circuit of the shift register unit connected to the pull-up node PU may output the gate driving signal normally, a corresponding row of pixel units receives the gate driving signal, and switching transistors included in the corresponding row of pixel units are turned on to write a data voltage on a corresponding data line in the column direction into the pixel unit of the corresponding row and the corresponding column to realize the normal display.

Optionally, the reset circuit may include a reset transistor, a gate electrode of the reset transistor is connected to a reset control terminal, a first electrode of the reset transistor is connected to the pull-up node, and a second electrode of the reset transistor is connected to a reset voltage terminal, the maintaining the potential of the pull-up node at the first voltage during the output stage of each display period by the reset control circuit includes: putting, by the reset control circuit, the reset transistor in a reverse locked state by controlling the potential of the reset control terminal and/or the potential of the reset voltage terminal during the output stage.

The reset control circuit is added into the shift register unit according to the embodiment of the present disclosure to reduce the leakage current of the reset transistor by controlling the potential of the reset control terminal and/or the potential of the reset voltage terminal without changing an existing timing during the output stage (the output stage is the stage in which the shift register unit outputs the corresponding gate driving signal), thereby realizing the control of the leakage current of the reset transistor, and avoiding an influence of the leakage current of the reset transistor on outputting the gate driving signal, and then the display is not affected.

According to an embodiment, the reset control circuit may control a gate-source voltage of the reset transistor in the reset circuit to be in a predetermined voltage range during the output stage by controlling the potential of the reset control terminal, or by controlling the potential of the reset control terminal and the potential of the reset voltage terminal, so that the reset transistor is in a reverse locked state (a cut-off state of a transistor), thereby reducing the leakage current of the reset transistor during the output phase; the reset transistor is an n-type transistor, the predetermined voltage range is smaller than or equal to 0V; or, the reset transistor is a p-type transistor, and the predetermined voltage range is larger than or equal to 0V.

In a practical operation, when the reset transistor is the n-type transistor, the gate-source voltage of the reset transistor is a positive voltage, even if the gate-source voltage is smaller than a threshold voltage of the reset transistor, the leakage current may also be generated due to backlight illumination, which causes an unstable output of the gate driving circuit and an abnormal display of a display module. Therefore, in the embodiments of the present disclosure, the reset transistor needs to be maintained in the reverse locked state, that is, when the reset transistor is the n-type transistor, the gate-source voltage of the reset transistor is smaller than or equal to 0V; or, when the reset transistor is the p-type transistor, and the gate-source voltage of the reset transistor is larger than or equal to 0V, so as to maintain the leakage current of the reset transistor at a minimum value, thus the display module may display normally.

According to another embodiment, the reset control circuit may reduce the leakage current of the reset transistor by controlling the potential of the reset voltage terminal during the output stage. For example, the potential of the reset voltage terminal may be set as the first voltage, so that potential of a source electrode of the reset transistor is equal to potential of a drain electrode of the reset transistor, thereby reducing the leakage current of the reset transistor.

In a practical operation, the display period further includes the reset stage, the method of driving the shift register unit includes: during the output stage, conducting, by the reset control circuit, a connection between the reset control terminal and the reset voltage terminal under the control of a reverse locking control terminal, to control the gate-source voltage of the reset transistor to be in the predetermined voltage range; during the reset stage, breaking, by the reset control circuit, the connection between the reset control terminal and the reset voltage terminal under the control of the reverse locking control terminal.

Optionally, the reverse locking control terminal includes a first reverse locking control terminal and a second reverse locking control terminal; the first reverse locking control terminal is connected to the pull-up node, and the second reverse locking control terminal is connected to a clock signal terminal; the method of driving the shift register unit further includes: during the output stage, conducting, by the reset control circuit, the connection between the reset control terminal and the reset voltage terminal under the control of the pull-up node and the clock signal terminal to control the gate-source voltage of the reset transistor to be in the predetermined voltage range; and during the reset stage, breaking, by the reset control circuit, the connection between the reset control terminal and the reset voltage terminal under the control of the clock signal terminal.

Optionally, the method of driving the shift register unit further includes: during the reset stage, under the control of the reset control terminal, controlling, by the reset circuit, the potential of the pull-up node to be a reset voltage, and controlling, by the reset circuit, a gate driving signal output terminal to output the reset voltage; the reset voltage is a voltage input to the reset voltage terminal.

Optionally, the display period further includes an input stage and an output cut-off maintaining stage, and the method of driving the shift register unit further includes: during the input stage, breaking, by the reset control circuit, the connection between the reset control terminal and the reset voltage terminal under the control of the clock signal terminal to control the gate-source voltage of the reset transistor to be in the predetermined voltage range; and during the output cut-off maintaining stage, breaking, by the reset control circuit, the connection between the reset control terminal and the reset voltage terminal under the control of the pull-up node to control the gate-source voltage of the reset transistor to be in the predetermined voltage range.

The gate driving circuit according to the embodiment of the present disclosure, includes a plurality stages of above shift register units; the shift register unit further includes a gate driving signal output terminal and an input terminal; except for a first stage of shift register unit, the input terminal of each stage of shift register unit is connected to the gate driving signal output terminal of a previous stage of shift register unit; and except for a last stage of shift register unit, a reset control terminal of each stage of shift register unit is connected to the gate driving signal output terminal of a next stage of shift register unit.

Figure 4:
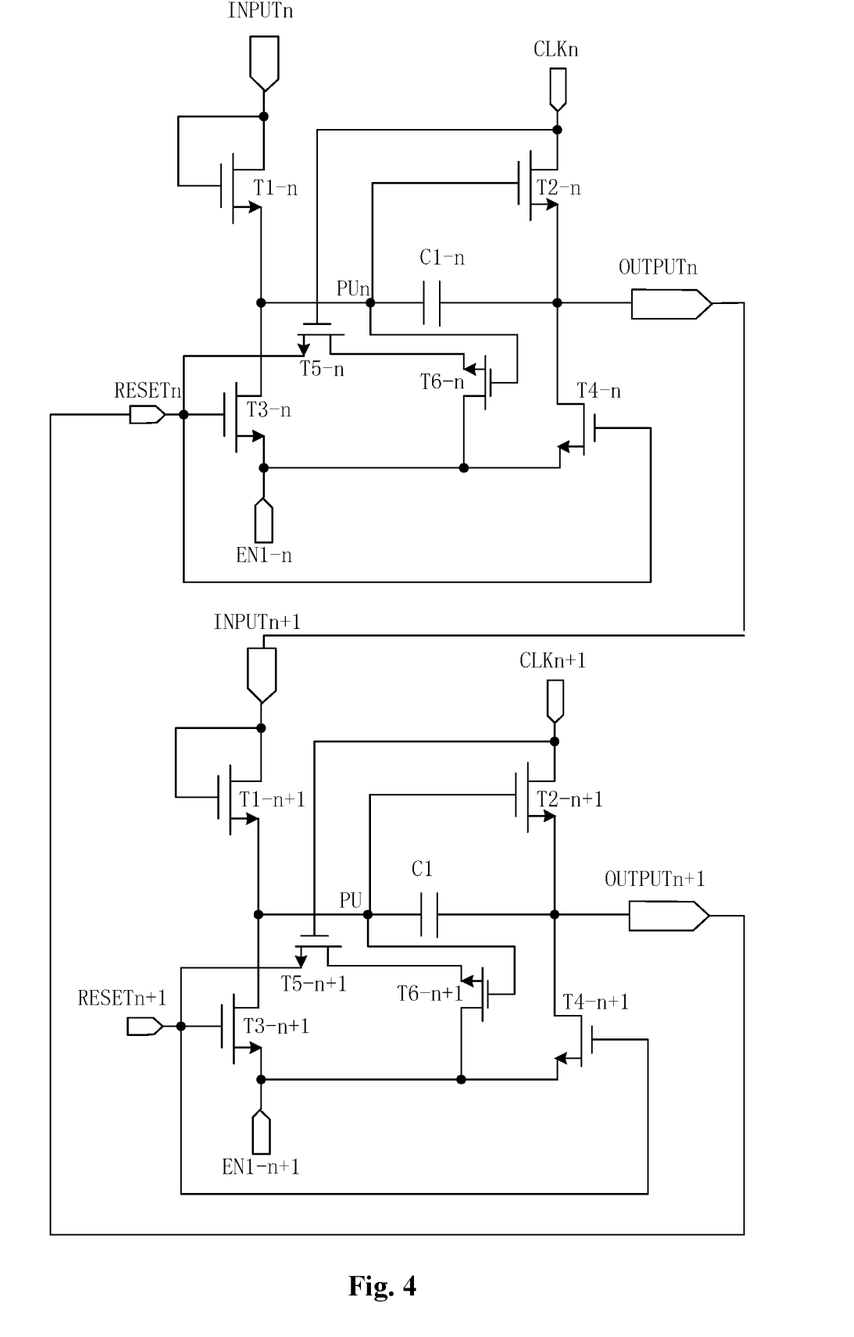
FIG. 4 is a schematic diagram of two stages of shift register units connected in a cascade manner and included in a gate driving circuit according to an embodiment of the present disclosure.

FIG. 4 shows an nth stage of shift register unit and an (n+1)th stage of shift register unit included in a gate driving circuit; n is a positive integer.

In FIG. 4, T1-$n$ denotes an input transistor included in the nth stage of shift register unit, and T2-$n$ denotes an output transistor included in the nth stage of shift register unit, T3-$n$ denotes a reset transistor included in the nth stage of shift register unit, T4-$n$ denotes an output reset transistor included in the nth stage of shift register unit, T5-$n$ denotes a second locking transistor included in the nth stage of shift register unit, T6-$n$ denotes a first locking transistor included in the nth stage of shift register unit; and C1-$n$ denotes a storage capacitor included in the nth stage of shift register unit.

T1-$n$+1 denotes an input transistor included in the (n+1)th stage of shift register unit, and T2-$n$+1 denotes an output transistor included in the (n+1)th stage of shift register unit, T3-$n$+1 denotes a reset transistor included in the (n+1)th stage of shift register unit, T4-$n$+1 denotes an output reset transistor included in the (n+1)th stage of shift register unit, T5-$n$+1 denotes a second locking transistor included in the (n+1)th stage of shift register unit, T6-$n$+1 denotes a first locking transistor included in the (n+1)th stage of shift register unit; and C1-$n$ denotes a storage capacitor included in the (n+1)th stage of shift register unit.

In FIG. 4, INPUTn denotes an input terminal of the nth stage of shift register unit, RESETn denotes a reset terminal of the nth stage of shift register unit, Pun denotes a pull-up node of the nth stage of shift register unit, and EN1-$n$ denotes a reset voltage terminal of the nth stage of shift register unit, CLKn denotes a clock signal terminal of the nth stage of shift register unit; OUTPUTn denotes a driving signal output terminal of the nth stage gate of shift register unit; INPUTn+1 denotes an input terminal of the (n+1)th stage of shift register unit, and RESETn+1 denotes a reset terminal of (n+1)th stage of shift register unit, Pun+1 denotes a pull-up node of the (n+1)th stage, EN1-$n$+1 denotes a reset voltage terminal of the (n+1)th stage of shift register unit, and CLKn+1 denotes a clock signal terminal of the (n+1)th stage of shift register unit, OUTPUTn+1 denotes a driving signal output terminal of the (n+1)th stage of shift register unit.

In FIG. 4, the OUTPUTn is connected to the INPUTn+1, and the OUTPUTn+1 is connected to the RESETn.

In FIG. 4, all transistors are n-type transistors, but are not limited thereto. A low level is input at both the EN1-$n$ and the EN-$n$+1.

Figure 5:
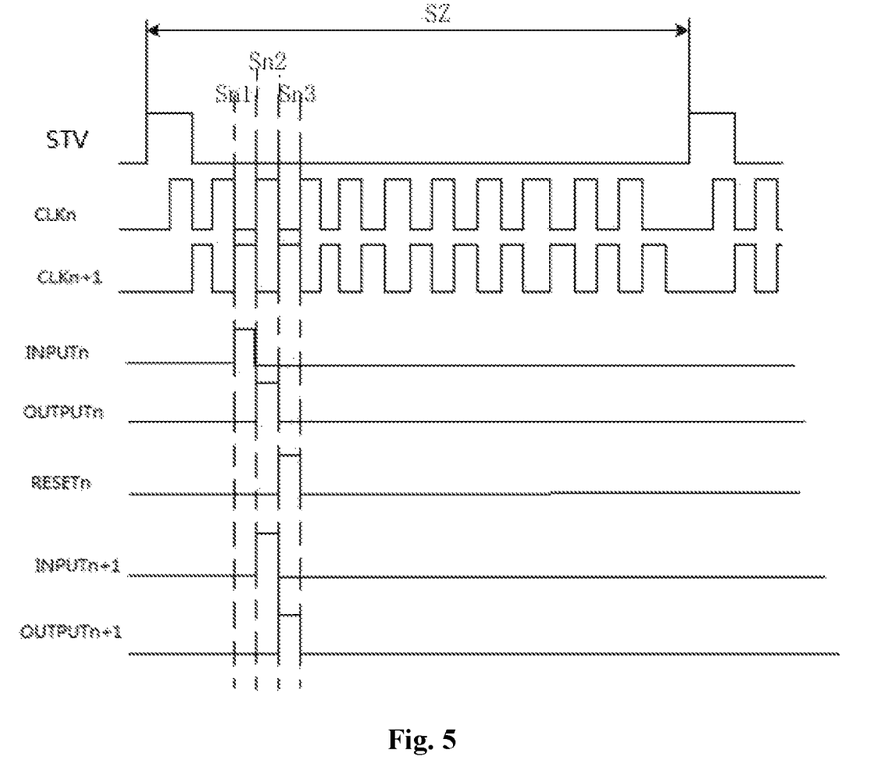
FIG. 5 is an operation timing diagram of the two stages of shift register units shown in FIG. 4.

As shown in FIG. 5, a clock signal of the nth stage of shift register unit input at the CLKn and a clock signal of the (n+1)th stage of shift register unit input at the CLKn+1 are opposite to each other in phase. In FIG. 5, a STV is a start signal, and the STV is the start signal of an input terminal of a first stage of shift register unit included in a gate driving circuit, and SZ denotes a frame of display time.

As shown in FIG. 5, when two stages of shift register units shown in FIG. 4 of the present disclosure is in operation, in an nth input stage Sn1, a high level is input at the INPUTn, a low level is input at the RESETn, the T1-$n$ is turned on, the Pun is charged, the potential of the Pun is maintained by the C1-$n$, a low level is input at the CLKn, the T2-$n$ is turned on, and a low level is output at the OUTPUTn.

In an nth output stage Sn2, a low level is input both at the INPUTn and the RESETn, a high level is input at the CLKn, the C1-$n$ boots the potential of the PU-n, the T2-$n$ is turned on, a high level is output at the OUTPUTn, an gate line corresponding to an nth row of pixel units maintains being turned on, the nth row of pixels start to receive a data signal, and the nth row of pixels on the display screen may be normally displayed; both the T5-$n$ and the T6-$n$ are turned on to enable the T3-$n$ in a reverse locked state, a leakage current of the T3-$n$ is maintained at a minimum value. Thus the high voltage of the PU-n is maintained, thereby avoiding the abnormal display caused by that a high level cannot be normally output at the OUTPUTn due to the leakage current of T3-$n$, and ensuring a normal display of the nth row of pixels.

The nth output stage Sn2 may also refer to an (n+1)th input stage, in the (n+1)th input stage, a high level is input at the INPUTn+1, a low level is input at the RESETn+1, the T1-$n$+1 is turned on, the Pun+1 is charged, potential of the Pun+1 is maintained by the C1-$n$+1, a low level is input at the CLKn+1, the T2-$n$+1 is turned on, and a low level is output at the OUTPUTn+1.

In an nth reset stage Sn3, a high level is input at the RESETn, a low level is input at the INPUTn, a low level is input at the CLKn, the T5-$n$ is turned off to break the connection between the RESETn and the EN1-$n$, and the T3-$n$ is turned on to discharge the potential of the PUn. And the T4-$n$ is turned on to conduct the connection between the OUTPUTn and the EN1-$n$, and a low level is output at the OUTPUTn.

The nth reset stage Sn3 may also refer to an (n+1)th output stage, in the (n+1)th output stage, a low level is both input at the INPUTn+1 and the RESETn+1, a high level is input at the CLKn+1, the C1-$n$+1 boots the potential of the PU-n+1, the T2-$n$+1 is turned on, a high level is output at the OUTPUTn+1, a gate line corresponding to an (n+1)th row of pixels maintains being turned on, the (n+1)th row of pixels start to receive the data signal, and the (n+1)th row of pixels on the display screen may be normally displayed; both the T5-$n$+1 and the T6-$n$+1 are turned on to enable the T3-$n$+1 in a reverse locked state, a leakage current of the T3-$n$+1 is maintained at a minimum value. Thus the high voltage of the PU-n+1 is maintained, thereby avoiding the abnormal display caused by that a high level cannot be normally output at the OUTPUTn+1 due to the leakage current of T3-$n$+1, and ensuring a normal display of the (n+1)th row of pixels.

The display device according to the embodiments of the present disclosure, includes the above gate driving circuit.

The display device may be any product or component with display function such as an electronic paper, an organic light emitting diode (OLED) display device, a mobile phone, a tablet computer, a television, a display, a notebook computer, a digital photo frame, a navigator, etc.

The above are optional embodiments of the present disclosure, it should be appreciated that, a person skilled in the art may make various modifications and improvements without departing from the spirit of the present disclosure, and these modifications and improvements shall also fall within the scope of the present disclosure.

What is claimed is:

1. A shift register unit, comprising a reset circuit and a reset control circuit, wherein
   the reset circuit is connected to a pull-up node and configured to reset a potential of the pull-up node during a reset stage; and
   the reset control circuit is connected to the reset circuit, and configured to maintain the potential of the pull-up node at a first voltage during an output stage of each display period,
   the reset control circuit comprises a first locking transistor and a second locking transistor,
   a gate electrode of the first locking transistor is connected to the pull-up node, and a first electrode of the first locking transistor is connected to a reset voltage terminal; and
   a gate electrode of the second locking transistor is connected to a clock signal terminal, a first electrode of the second locking transistor is connected to a second electrode of the first locking transistor, and a second electrode of the second locking transistor is connected to the reset control terminal.

2. The shift register unit according to claim 1, wherein the reset circuit comprises a reset transistor, a gate electrode of the reset transistor is connected to a reset control terminal, a first electrode of the reset transistor is connected to the pull-up node, and a second electrode of the reset transistor is connected to a reset voltage terminal, one of the first electrode and the second electrode is a source electrode, and the other of the first electrode and the second electrode is a drain electrode; and
   the reset control circuit is connected to the reset control terminal and the reset voltage terminal, and the reset transistor is put in a reverse locked state by controlling a potential of the reset control terminal and/or a potential of the reset voltage terminal during the output stage.

3. The shift register unit according to claim 2, wherein during the reset stage, the reset control circuit breaks a connection between the reset control terminal and the reset voltage terminal under the control of a reverse locking control terminal.

4. The shift register unit according to claim 2, wherein, during the output stage, the reset control circuit conducts a connection between the reset control terminal and the reset voltage terminal under the control of a reverse locking control terminal to control a gate-source voltage of the reset transistor to be in a predetermined voltage range;
   the reset transistor is an n-type transistor, the predetermined voltage range is smaller than or equal to 0V; or the reset transistor is a p-type transistor, and the predetermined voltage range is larger than or equal to 0V.

5. The shift register unit according to claim 4, wherein the reverse locking control terminal comprises a first reverse locking control terminal and a second reverse locking control terminal;
   the first reverse locking control terminal is connected to the pull-up node, and the second reverse locking control terminal is connected to a clock signal terminal.

6. The shift register unit according to claim 1, further comprising an output circuit; wherein,
   the output circuit is respectively connected to the pull-up node, a clock signal terminal and a gate driving signal output terminal, and is configured to write a clock signal output by the clock signal terminal to the gate driving signal output terminal under the control of the pull-up node during an input stage and during the output stage; and the reset circuit is further connected to the gate driving signal output terminal, and is configured to, during the reset stage, to write a reset voltage output by a reset voltage terminal to the gate driving signal output terminal under the control of a reset control terminal, to reset a voltage of the gate driving signal output terminal.

7. The shift register unit according to claim 6, wherein, the output circuit comprises an output transistor, and the reset circuit further comprises an output reset transistor, a gate electrode of the output transistor is connected to the pull-up node, a first electrode of the output transistor is connected to the clock signal terminal, and a second electrode of the output transistor is connected to the gate driving signal output terminal; and a gate electrode of the output reset transistor is connected to the reset control terminal, a first electrode of the output reset transistor is connected to the gate driving signal output terminal, and a second electrode of the output reset transistor is connected to the reset voltage terminal.

8. The shift register unit according to claim 1, further comprising:

an input circuit respectively connected to an input terminal and the pull-up node, and configured to control the potential of the pull-up node under the control of the input terminal during an input stage; and a storage circuit connected to the pull-up node and configured to maintain the potential of the pull-up node during the input stage and boost the potential of the pull-up node during the output stage.

9. The shift register unit according to claim 8, wherein the input circuit comprises an input transistor, both a gate electrode of the input transistor and a first electrode of the input transistor are connected to the input terminal, and a second electrode of the input transistor is connected to the pull-up node; and the storage circuit comprises a storage capacitor, a first electrode of the storage capacitor is connected to the pull-up node, and a second electrode of the storage capacitor is connected to the gate driving signal output terminal.

10. A method of driving the shift register unit according to claim 1, comprising:

maintaining, by the reset control circuit, the potential of the pull-up node at the first voltage during the output stage of each display period.

11. The method according to claim 10, wherein the reset circuit comprises a reset transistor, a gate electrode of the reset transistor is connected to a reset control terminal, a first electrode of the reset transistor is connected to the pull-up node, and a second electrode of the reset transistor is connected to a reset voltage terminal, the maintaining, by the reset control circuit, the potential of the pull-up node at the first voltage during the output stage of each display period comprises:

putting, by the reset control circuit, the reset transistor in a reverse locked state by controlling a potential of the reset control terminal and/or a potential of the reset voltage terminal during the output stage.

12. The method according to claim 11, wherein the putting, by the reset control circuit, the reset transistor in a reverse locked state by controlling a potential of the reset control terminal and/or a potential of the reset voltage terminal during the output stage comprises:

conducting, by the reset control circuit, a connection between the reset control terminal and the reset voltage terminal under the control of a reverse locking control terminal during the output stage, to control a gate-source voltage of the reset transistor to be in a predetermined voltage range;

wherein the reset transistor is an n-type transistor, the predetermined voltage range is smaller than or equal to 0V; or the reset transistor is a p-type transistor, and the predetermined voltage range is larger than or equal to 0V.

13. The method according to claim 12, wherein the display period further comprises the reset stage, the method further comprises:

breaking, by the reset control circuit, the connection between the reset control terminal and the reset voltage terminal under the control of the reverse locking control terminal during the reset stage.

14. The method according to claim 13, wherein the reverse locking control terminal comprises a first reverse locking control terminal and a second reverse locking control terminal; the first reverse locking control terminal is connected to the pull-up node, and the second reverse locking control terminal is connected to a clock signal terminal; the method further comprises:

conducting, by the reset control circuit, the connection between the reset control terminal and the reset voltage terminal under the control of the pull-up node and the clock signal terminal during the output stage, to control the gate-source voltage of the reset transistor to be in the predetermined voltage range; and breaking, by the reset control circuit, the connection between the reset control terminal and the reset voltage terminal under the control of the clock signal terminal during the reset stage.

15. The method according to claim 14, further comprising:

controlling, by the reset circuit, during the reset stage, under the control of the reset control terminal, the potential of the pull-up node to be a reset voltage, and a gate driving signal output terminal to output the reset voltage;

wherein the reset voltage is a voltage input at the reset voltage terminal.

16. The method according to claim 15, wherein the display period further comprises an input stage and an output cut-off maintaining stage, and the method further comprises:

breaking, by the reset control circuit, the connection between the reset control terminal and the reset voltage terminal under the control of the clock signal terminal during the input stage, to control the gate-source voltage of the reset transistor to be in the predetermined voltage range; and breaking, by the reset control circuit, the connection between the reset control terminal and the reset voltage terminal under the control of the pull-up node during the output cut-off maintaining stage, to control the gate-source voltage of the reset transistor to be in the predetermined voltage range.

17. A gate driving circuit, comprising a plurality stages of shift register units according to claim 1; the shift register unit further comprises a gate driving signal output terminal and an input terminal;

except for a first stage of shift register unit, the input terminal of each stage of shift register unit is connected to the gate driving signal output terminal of a previous stage of shift register unit; and except for a last stage of shift register unit, a reset control terminal of each stage of shift register unit is connected to the gate driving signal output terminal of a next stage of shift register unit.

18. A display device, comprising the gate driving circuit according to claim 17.

* * * * *